(12) United States Patent
Takata

(10) Patent No.: US 12,542,534 B2
(45) Date of Patent: Feb. 3, 2026

(54) FILTER DEVICE, MULTIPLEXER, HIGH FREQUENCY FRONT END CIRCUIT, AND COMMUNICATION APPARATUS

(71) Applicant: Murata Manufacturing Co., Ltd., Nagaokakyo (JP)

(72) Inventor: Toshiaki Takata, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 384 days.

(21) Appl. No.: 17/864,538

(22) Filed: Jul. 14, 2022

(65) Prior Publication Data

US 2023/0080910 A1 Mar. 16, 2023

Related U.S. Application Data

(63) Continuation of application No. PCT/JP2020/041922, filed on Nov. 10, 2020.

(30) Foreign Application Priority Data

Jan. 24, 2020 (JP) ................................ 2020-010227

(51) Int. Cl.
*H04B 1/38* (2015.01)
*H03H 9/13* (2006.01)
(Continued)

(52) U.S. Cl.
CPC ............ *H03H 9/542* (2013.01); *H03H 9/133* (2013.01); *H03H 9/70* (2013.01)

(58) Field of Classification Search
CPC .......... H03H 9/542; H03H 9/133; H03H 9/70; H03H 9/6436; H03H 9/725; H03H 9/6483;
(Continued)

(56) References Cited

U.S. PATENT DOCUMENTS 5,115,216 A * 5/1992 Hikita ................. H03H 9/6463
333/195
5,202,652 A * 4/1993 Tabuchi ............... H03H 9/6483
333/133
(Continued)

FOREIGN PATENT DOCUMENTS

JP 2018038040 A 3/2018
JP 2018078489 A 5/2018
(Continued)

OTHER PUBLICATIONS

International Search Report in PCT/JP2020/041922, mailed Dec. 22, 2020, 3 pages.
(Continued)

*Primary Examiner* — Stephen M D Agosta
(74) *Attorney, Agent, or Firm* — Keating & Bennett, LLP

(57) ABSTRACT

A filter device includes a filter circuit including series-arm resonators and series-arm-resonator connecting wires, and an additional circuit including a resonator including first and second interdigital transducer electrodes, first and second capacitors connected between the first and second interdigital transducer electrodes and the filter circuit, and first and second I-C connecting wires connected to the first and second interdigital transducer electrodes and the first and second capacitors, the additional circuit being connected in parallel with a portion of the series-arm resonators in the filter circuit. The first and second interdigital transducer electrodes are output-side interdigital transducer electrodes. A capacitance of the first capacitor is smaller than the capacitance of the second capacitor. A shortest distance among distances between the first I-C connecting wire and the series-arm-resonator connecting wires is shortest among shortest distances between the I-C connecting wires and the series-arm-resonator connecting wires.

19 Claims, 5 Drawing Sheets

(51) Int. Cl.
*H03H 9/54* (2006.01)
*H03H 9/70* (2006.01)

(58) Field of Classification Search
CPC .. H03H 9/02574; H03H 9/14541; H04B 1/00; H04B 1/40
See application file for complete search history.

(56) References Cited

U.S. PATENT DOCUMENTS

| | | | | |
|---|---|---|---|---|
| 5,905,418 A * | 5/1999 | Ehara | H03H 9/0576 | 333/195 |
| 6,034,577 A * | 3/2000 | Matsui | H03H 9/14552 | 333/195 |
| 6,150,904 A * | 11/2000 | Taniguchi | H03H 9/6483 | 333/195 |
| 6,292,071 B1 * | 9/2001 | Taniguchi | H03H 9/6483 | 333/194 |
| 6,621,193 B1 * | 9/2003 | Nishimura | H03H 9/605 | 310/366 |
| 6,975,185 B2 * | 12/2005 | Tsutsumi | H03H 9/6483 | 333/195 |
| 7,453,334 B1 * | 11/2008 | Abbott | H03H 9/02944 | 333/195 |
| 8,384,495 B2 * | 2/2013 | Fujiwara | H03H 9/725 | 333/195 |
| 9,035,726 B2 * | 5/2015 | Thomas | H03H 9/02921 | 333/195 |
| 9,391,570 B2 * | 7/2016 | Kong | H01Q 23/00 | |
| 9,525,393 B1 * | 12/2016 | Raihn | G06F 30/327 | |
| 9,712,139 B2 * | 7/2017 | Taniguchi | H03H 9/6426 | |
| 9,847,770 B2 * | 12/2017 | Nakagawa | H03H 9/725 | |
| 10,177,740 B2 * | 1/2019 | Michigami | H03H 9/6483 | |
| 10,476,482 B2 * | 11/2019 | Niwa | H04B 1/18 | |
| 10,630,257 B2 * | 4/2020 | Nosaka | H03H 9/14541 | |
| 10,680,578 B2 * | 6/2020 | Saji | H10N 30/8542 | |
| 10,848,128 B2 * | 11/2020 | Yamada | H03H 9/14576 | |
| 10,886,892 B2 * | 1/2021 | Nosaka | H03H 9/25 | |
| 10,958,246 B2 * | 3/2021 | Miyamoto | H03H 9/6483 | |
| 10,958,247 B2 * | 3/2021 | Kanazawa | H03H 9/14582 | |
| 10,979,020 B2 * | 4/2021 | Nosaka | H03H 9/02007 | |
| 11,082,031 B2 * | 8/2021 | Nosaka | H04B 1/40 | |
| 11,309,867 B2 * | 4/2022 | Urata | H03H 9/02834 | |
| 11,405,021 B2 * | 8/2022 | Araki | H03H 9/25 | |
| 11,469,736 B2 * | 10/2022 | Watanabe | H03H 9/14526 | |
| 12,143,097 B2 * | 11/2024 | Omura | H03H 9/6489 | |
| 12,334,898 B2 * | 6/2025 | Matsumoto | H03H 9/02086 | |
| 2001/0010484 A1 * | 8/2001 | Nakamura | H03H 9/02992 | 333/195 |
| 2003/0183864 A1 * | 10/2003 | Miyazawa | H10D 84/212 | 257/532 |
| 2004/0080384 A1 * | 4/2004 | Takeda | H03H 9/6483 | 333/195 |
| 2004/0095206 A1 * | 5/2004 | Tsutsumi | H03H 9/6483 | 333/195 |
| 2005/0110596 A1 * | 5/2005 | Yamakawa | H03H 9/605 | 333/189 |
| 2006/0139125 A1 * | 6/2006 | Shiga-ken | H03H 9/1085 | 333/193 |
| 2007/0046395 A1 * | 3/2007 | Tsutsumi | H03H 9/72 | 333/133 |
| 2007/0109073 A1 * | 5/2007 | Yamakawa | H03H 9/605 | 333/133 |
| 2007/0109075 A1 * | 5/2007 | Igaki | H03H 9/14588 | 333/195 |
| 2008/0315973 A1 * | 12/2008 | Nakamura | H03H 9/6433 | 333/133 |
| 2009/0002916 A1 * | 1/2009 | Wei | H01G 4/005 | 361/303 |
| 2009/0058555 A1 * | 3/2009 | Takata | H03H 9/0576 | 333/129 |
| 2010/0109801 A1 * | 5/2010 | Inoue | H03H 9/725 | 333/186 |
| 2011/0080234 A1 * | 4/2011 | Haruta | H03H 9/1071 | 333/193 |
| 2012/0025931 A1 * | 2/2012 | Yamamoto | H03H 9/0222 | 310/313 C |
| 2012/0139662 A1 * | 6/2012 | Fujiwara | H03H 9/64 | 333/133 |
| 2012/0161903 A1 * | 6/2012 | Thomas | H03H 9/6433 | 333/195 |
| 2013/0002372 A1 * | 1/2013 | Uesaka | H03H 9/6483 | 333/195 |
| 2013/0241674 A1 * | 9/2013 | Yamazaki | H03H 9/64 | 333/189 |
| 2014/0176258 A1 * | 6/2014 | Yasuda | H03H 7/42 | 333/133 |
| 2015/0054597 A1 * | 2/2015 | Yasuda | H03H 9/6423 | 333/195 |
| 2016/0094198 A1 * | 3/2016 | Takamine | H03H 9/6433 | 333/186 |
| 2016/0149556 A1 * | 5/2016 | Kando | H03H 9/25 | 333/195 |
| 2016/0173062 A1 * | 6/2016 | Takamine | H03H 9/6433 | 333/133 |
| 2016/0285431 A1 * | 9/2016 | Nakahashi | H03H 9/0009 | |
| 2017/0093373 A1 * | 3/2017 | Fujiwara | H03H 9/6413 | |
| 2017/0099044 A1 * | 4/2017 | Takamine | H03H 9/1092 | |
| 2017/0117873 A1 * | 4/2017 | Takata | H03H 9/54 | |
| 2017/0134005 A1 * | 5/2017 | Takeuchi | H03H 7/1766 | |
| 2017/0179928 A1 * | 6/2017 | Raihn | H03H 9/542 | |
| 2017/0194938 A1 * | 7/2017 | Michigami | H03H 9/6483 | |
| 2017/0201228 A1 * | 7/2017 | Kuzushita | H03H 9/13 | |
| 2017/0294896 A1 * | 10/2017 | Nosaka | H03H 9/6483 | |
| 2017/0353174 A1 * | 12/2017 | Komatsu | H03H 9/02866 | |
| 2018/0013405 A1 * | 1/2018 | Takata | H03H 9/6423 | |
| 2018/0026606 A1 * | 1/2018 | Takata | H04L 5/1461 | 370/278 |
| 2018/0048308 A1 * | 2/2018 | Oshita | H03K 17/002 | |
| 2018/0069529 A1 * | 3/2018 | Bi | H03H 9/54 | |
| 2018/0069574 A1 * | 3/2018 | Kondo | H03F 3/72 | |
| 2018/0123564 A1 * | 5/2018 | Bergmann | H03H 9/1455 | |
| 2018/0131344 A1 * | 5/2018 | Komatsu | H03H 9/0014 | |
| 2018/0131348 A1 * | 5/2018 | Takahashi | H03H 9/1457 | |
| 2018/0138891 A1 * | 5/2018 | Ozasa | H03H 9/6489 | |
| 2018/0152169 A1 * | 5/2018 | Goto | H03H 9/02574 | |
| 2018/0152191 A1 * | 5/2018 | Niwa | H01P 1/2005 | |
| 2018/0227006 A1 * | 8/2018 | Yasuda | H04B 1/18 | |
| 2018/0343000 A1 * | 11/2018 | Nosaka | H03H 9/72 | |
| 2019/0028085 A1 * | 1/2019 | Kato | H03F 3/72 | |
| 2019/0052244 A1 * | 2/2019 | Saji | H03H 9/02574 | |
| 2019/0097606 A1 * | 3/2019 | Nosaka | H04B 1/40 | |
| 2019/0103843 A1 * | 4/2019 | Aikawa | H03F 3/189 | |
| 2019/0158062 A1 * | 5/2019 | Horita | H03H 9/605 | |
| 2019/0222198 A1 * | 7/2019 | Tsukamoto | H03H 9/6403 | |
| 2019/0267969 A1 * | 8/2019 | Tsukamoto | H03H 9/6403 | |
| 2019/0267970 A1 * | 8/2019 | Nosaka | H03H 9/54 | |
| 2019/0363698 A1 * | 11/2019 | Nosaka | H03H 9/725 | |
| 2020/0067489 A1 * | 2/2020 | Takata | H03H 9/6496 | |
| 2020/0091892 A1 * | 3/2020 | Watanabe | H04B 1/0057 | |
| 2020/0112299 A1 * | 4/2020 | Muranaka | H03H 9/02637 | |
| 2020/0136590 A1 * | 4/2020 | Nosaka | H03H 9/542 | |
| 2020/0144991 A1 * | 5/2020 | Nosaka | H03H 9/6483 | |
| 2020/0144992 A1 * | 5/2020 | Nosaka | H03H 9/6476 | |
| 2020/0252054 A1 * | 8/2020 | Takata | H03H 9/6483 | |
| 2020/0280302 A1 * | 9/2020 | Miyamoto | H03H 9/1457 | |
| 2020/0304102 A1 * | 9/2020 | Kanazawa | H03H 9/725 | |
| 2021/0083700 A1 | 3/2021 | Muranaka | | |
| 2021/0119611 A1 * | 4/2021 | Koreeda | H03H 9/145 | |
| 2021/0184706 A1 * | 6/2021 | Hisano | H03H 7/075 | |
| 2021/0226610 A1 * | 7/2021 | Komatsu | H03H 9/6476 | |
| 2021/0273633 A1 * | 9/2021 | Osada | H03H 9/542 | |
| 2022/0263533 A1 * | 8/2022 | Nakazawa | H04B 1/04 | |
| 2022/0352875 A1 * | 11/2022 | Takata | H03H 9/25 | |

(56) References Cited

U.S. PATENT DOCUMENTS

2023/0066774 A1* 3/2023 Nakagawa ......... H03H 9/02102
2023/0121885 A1* 4/2023 Matsumoto ......... H03H 9/1014
                                                    333/124

FOREIGN PATENT DOCUMENTS

| JP | 2018088678 A  | 6/2018  |
| WO | 2019244938 A1 | 12/2019 |

OTHER PUBLICATIONS

Written Opinion in PCT/JP2020/041922, mailed Dec. 22, 2020, 3 pages.

* cited by examiner

FILTER DEVICE, MULTIPLEXER, HIGH FREQUENCY FRONT END CIRCUIT, AND COMMUNICATION APPARATUS

CROSS REFERENCE TO RELATED APPLICATIONS

This application claims the benefit of priority to Japanese Patent Application No. 2020-010227 filed on Jan. 24, 2020 and is a Continuation Application of PCT Application No. PCT/JP2020/041922 filed on Nov. 10, 2020. The entire contents of each application are hereby incorporated herein by reference.

BACKGROUND OF THE INVENTION

1. Field of the Invention

The present invention relates to a filter device, a multiplexer, a high frequency front end circuit, and a communication apparatus.

2. Description of the Related Art

Filter devices have been widely used for cellular phones and the like. An example of a filter device is disclosed in Japanese Unexamined Patent Application Publication No. 2018-038040. In this filter device, to improve attenuation characteristics, a phase shift circuit is connected in parallel with a main filter circuit. As an example of a main filter circuit, a ladder filter configured to be a transmission filter of a duplexer is disclosed. The phase shift circuit includes a plurality of slanted-finger interdigital transducer (SFIT) electrodes. The phase shift circuit further includes a plurality of capacitors connected between the plurality of SFIT electrodes and the main filter circuit.

However, if the main filter circuit and the phase shift circuit described in Japanese Unexamined Patent Application Publication No. 2018-038040 are arranged on a piezoelectric substrate, a wire that connects the phase shift circuit to the main filter circuit may be electromagnetically coupled to a wire that connects resonators in the main filter circuit. In this case, a signal flowing in the main filter circuit leaks into the phase shift circuit, and the leakage may deteriorate attenuation characteristics of the filter.

SUMMARY OF THE INVENTION

Preferred embodiments of the present invention provide filter devices, multiplexers, high frequency front end circuits, and communication apparatuses that are each able to improve attenuation characteristics.

A filter device according to a preferred embodiment of the present invention includes a filter circuit including at least three series-arm resonators on a piezoelectric substrate and a plurality of series-arm-resonator connecting wires connecting the series-arm resonators, and an additional circuit including a resonator including at least three interdigital transducer electrodes, a plurality of capacitors, and a plurality of I-C connecting wires each connecting any one of at least two of the at least three interdigital transducer electrodes to any one of the plurality of capacitors, the additional circuit being connected in parallel with at least a portion of the series-arm resonators in the filter circuit. The at least three interdigital transducer electrodes include a first interdigital transducer electrode and a second interdigital transducer electrode. The first interdigital transducer electrode and the second interdigital transducer electrode are input-side interdigital transducer electrodes or output-side interdigital transducer electrodes. The plurality of capacitors include a first capacitor and a second capacitor. The first interdigital transducer electrode and the first capacitor are connected by a first I-C connecting wire of the plurality of I-C connecting wires, and the second interdigital transducer electrode and the second capacitor are connected by a second I-C connecting wire of the plurality of I-C connecting wires. A capacitance of the first capacitor is smaller than a capacitance of the second capacitor. A shortest distance among distances between the first I-C connecting wire and the plurality of series-arm-resonator connecting wires in the filter circuit is shortest among shortest distances between the plurality of I-C connecting wires and the plurality of series-arm-resonator connecting wires.

A multiplexer according to a preferred embodiment of the present invention includes a common connection terminal, and a plurality of filter devices that are connected in common to the common connection terminal. The plurality of filter devices include a filter device according to a preferred embodiment of the present invention.

A high frequency front end circuit according to a preferred embodiment of the present invention includes a plurality of filter devices, and a power amplifier connected to the plurality of filter devices. The plurality of filter devices include a filter device according to a preferred embodiment of the present invention.

A communication apparatus according to a preferred embodiment of the present invention includes a high frequency front end circuit according to a preferred embodiment of the present invention, and an RF signal processing circuit that is connected to the high frequency front end circuit.

According to preferred embodiments of the present invention, filter devices, multiplexers, high frequency front end circuits, and communication apparatuses that are each able to improve attenuation characteristics are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, the present invention will be explained with specific descriptions of preferred embodiments of the present invention with reference to the drawings.

Preferred embodiments described herein are illustrative and partial replacement or combination of configurations in different preferred embodiments may be made.

Figure 1:
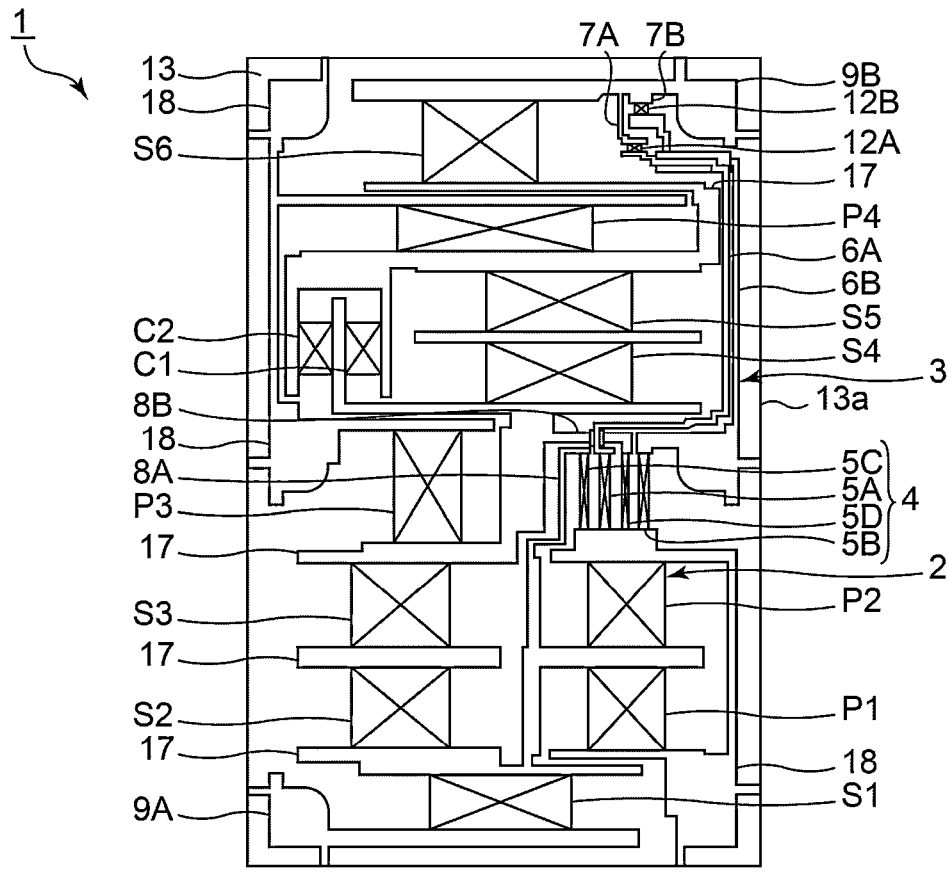
FIG. 1 is a schematic plan view illustrating an electrode configuration of a filter device according to a first preferred embodiment of the present invention.
Figure 2:
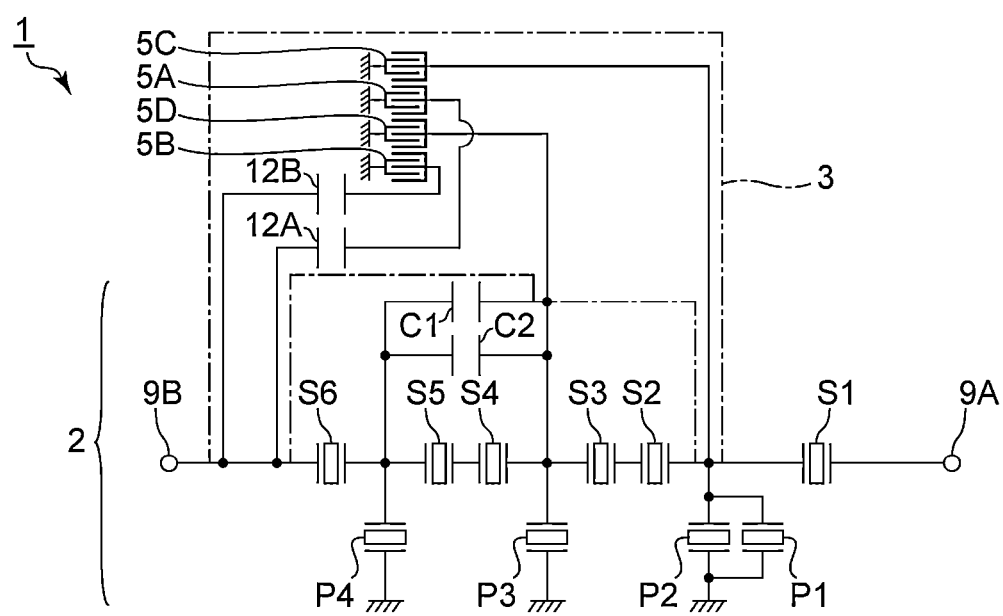
FIG. 2 is a circuit diagram of the filter device according to the first preferred embodiment of the present invention.

FIG. 1 is a schematic plan view illustrating an electrode configuration of a filter device according to a first preferred embodiment of the present invention. FIG. 2 is a circuit diagram of the filter device according to the first preferred embodiment. In FIG. 1, resonators, interdigital transducer electrodes, reflectors, and capacitors, which will be described later, are illustrated by way of schematic representation by adding two diagonal lines to rectangles. Similar schematic representation may also be used in other schematic plan views other than FIG. 1.

As illustrated in FIG. 1, a filter device 1 includes a piezoelectric substrate 13. In the present preferred embodiment, the piezoelectric substrate 13 includes only a piezoelectric layer. More specifically, the piezoelectric substrate 13 is, for example, a Y-cut lithium niobate ($LiNbO_3$) substrate. However, the material of the piezoelectric layer is not limited to the above but may be, for example, lithium tantalate, zinc oxide, aluminum nitride, crystal, or PZT (lead zirconate titanate), or the like. The piezoelectric substrate 13 may be a multilayer substrate including a piezoelectric layer.

The filter device 1 includes a filter circuit 2 and an additional circuit 3. The filter circuit 2 and the additional circuit 3 are provided on the piezoelectric substrate 13. In the present preferred embodiment, the filter circuit 2 is, for example, a ladder filter circuit including a plurality of series-arm resonators, a plurality of parallel-arm resonators, and a plurality of series-arm-resonator connecting wires 17. More specifically, a series-arm resonator S1, a series-arm resonator S2, a series-arm resonator S3, a series-arm resonator S4, a series-arm resonator S5, and a series-arm resonator S6 are connected in series in this order in the filter circuit 2. The plurality of series-arm resonators are connected by the series-arm-resonator connecting wires 17. The plurality of series-arm-resonator connecting wires 17 are hot wires in the filter circuit 2. The filter circuit 2 only needs to include at least the plurality of series-arm resonators and the plurality of series-arm-resonator connecting wires 17.

The additional circuit 3 outputs a cancellation signal. The phase of a signal in a predetermined frequency band output from the filter circuit 2 and the phase of a cancellation signal in the predetermined frequency band are opposite. The predetermined frequency band is outside the pass band of the filter circuit 2. Since a signal output from the filter circuit 2 is offset by a cancellation signal outside the pass band of the filter circuit 2, a large out-of-band attenuation amount can be achieved in the filter device 1. The additional circuit 3 of the filter device 1 includes a resonator 4, a plurality of capacitors, and a plurality of I-C connecting wires.

As illustrated in FIG. 2, the additional circuit 3 is connected in parallel with a portion of the series-arm resonators of the filter circuit 2. More specifically, the additional circuit 3 is connected in parallel with the series-arm resonator S2, the series-arm resonator S3, the series-arm resonator S4, the series-arm resonator S5, and the series-arm resonator S6. However, the additional circuit 3 only needs to be connected in parallel with at least a portion of the series-arm resonators of the filter circuit 2, and the additional circuit 3 may be connected in parallel with all of the series-arm resonators of the filter circuit 2.

Figure 3:
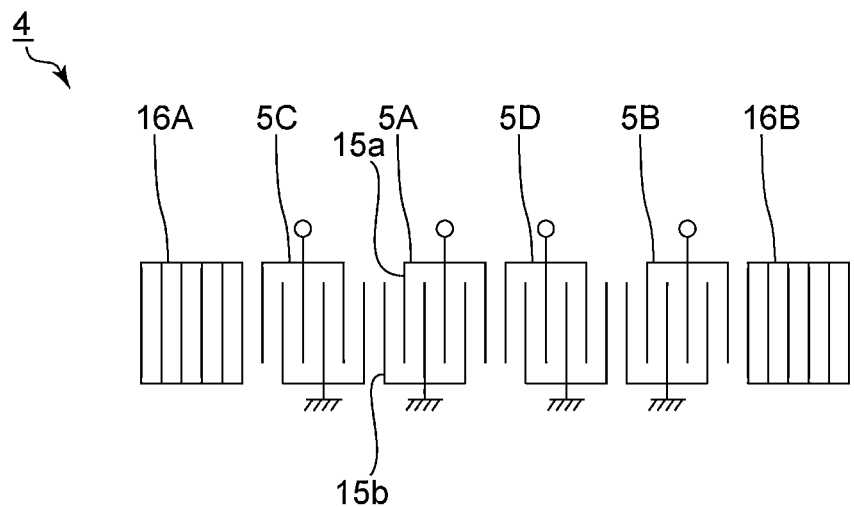
FIG. 3 is a schematic plan view illustrating an electrode configuration of a resonator in an additional circuit in the first preferred embodiment of the present invention.

FIG. 3 is a schematic plan view illustrating an electrode configuration of a resonator in the additional circuit in the first preferred embodiment.

The resonator 4 in the additional circuit 3 includes a plurality of interdigital transducer electrodes. More specifically, the plurality of interdigital transducer electrodes include a first interdigital transducer electrode 5A, a second interdigital transducer electrode 5B, a third interdigital transducer electrode 5C, and a fourth interdigital transducer electrode 5D. The plurality of interdigital transducer electrodes are provided on the piezoelectric substrate 13 illustrated in FIG. 1. A pair of reflectors 16A and 16B are provided on sides of the plurality of interdigital transducer electrodes on the piezoelectric substrate 13 in an acoustic wave propagation direction. The reflector 16A, the third interdigital transducer electrode 5C, the first interdigital transducer electrode 5A, the fourth interdigital transducer electrode 5D, the second interdigital transducer electrode 5B, and the reflector 16B are arranged in this order in the resonator 4. However, the plurality of interdigital transducer electrodes are not necessarily arranged in the order described above, and the number of the plurality of interdigital transducer electrodes is not limited to four. The number of the plurality of interdigital transducer electrodes may be, for example, three or more.

The first interdigital transducer electrode 5A includes a first comb-shaped electrode 15a and a second comb-shaped electrode 15b. Each of the first comb-shaped electrode 15a and the second comb-shaped electrode 15b includes a plurality of electrode fingers. The first comb-shaped electrode 15a and the second comb-shaped electrode 15b are interdigitated with each other. In the same or similar manner, each of the second interdigital transducer electrode 5B, the third interdigital transducer electrode 5C, and the fourth interdigital transducer electrode 5D includes a first comb-shaped electrode and a second comb-shaped electrode. Each of the first comb-shaped electrodes is connected to a signal potential. In contrast, each of the second comb-shaped electrodes is connected to a ground potential.

The plurality of interdigital transducer electrodes of the resonator 4 in the additional circuit 3 include an input-side interdigital transducer electrode and an output-side interdigital transducer electrode. Herein, the input-side interdigital transducer electrode represents an interdigital transducer electrode that is connected to a series-arm-resonator connecting wire closer to an input end than to an output end or connected to the input end, of a plurality of series-arm-resonator connecting wires in a portion with which the additional circuit is connected in parallel, in the filter circuit. In contrast, the output-side interdigital transducer electrode represents an interdigital transducer electrode that is connected to a series-arm-resonator connecting wire closer to the output end than to the input end or connected to the output end, of the plurality of series-arm-resonator connecting wires in the portion with which the additional circuit is connected in parallel, in the filter circuit.

Referring back to FIG. 2, in the present preferred embodiment, the first interdigital transducer electrode 5A and the second interdigital transducer electrode 5B are output-side interdigital transducer electrodes. The third interdigital transducer electrode 5C and the fourth interdigital transducer electrode 5D are input-side interdigital transducer electrodes. However, the first interdigital transducer electrode 5A and the second interdigital transducer electrode 5B may be input-side interdigital transducer electrodes. In this case, only at least one interdigital transducer electrode other than the first interdigital transducer electrode 5A and the second interdigital transducer electrode 5B needs to be an output-side interdigital transducer electrode.

In the present preferred embodiment, the plurality of capacitors in the additional circuit 3 are a first capacitor 12A and a second capacitor 12B. The first capacitor 12A is connected between the first interdigital transducer electrode 5A and the filter circuit 2. The second capacitor 12B is connected between the second interdigital transducer electrode 5B and the filter circuit 2. The first capacitor 12A and the second capacitor 12B are elements to adjust the amplitude of a cancellation signal from the additional circuit 3. The out-of-band attenuation amount in the filter device 1 depends on the capacitances of the first capacitor 12A and the second capacitor 12B. The capacitance of the first capacitor 12A is smaller than the capacitance of the second capacitor 12B.

In the present preferred embodiment, the plurality of I-C connecting wires in the additional circuit 3 are a first I-C connecting wire 6A and a second I-C connecting wire 6B illustrated in FIG. 1. The first interdigital transducer electrode 5A and the first capacitor 12A are connected by the first I-C connecting wire 6A. The second interdigital transducer electrode 5B and the second capacitor 12B are connected by the second I-C connecting wire 6B. The first I-C connecting wire 6A and the second I-C connecting wire 6B are hot wires in the additional circuit 3.

Figure 4:
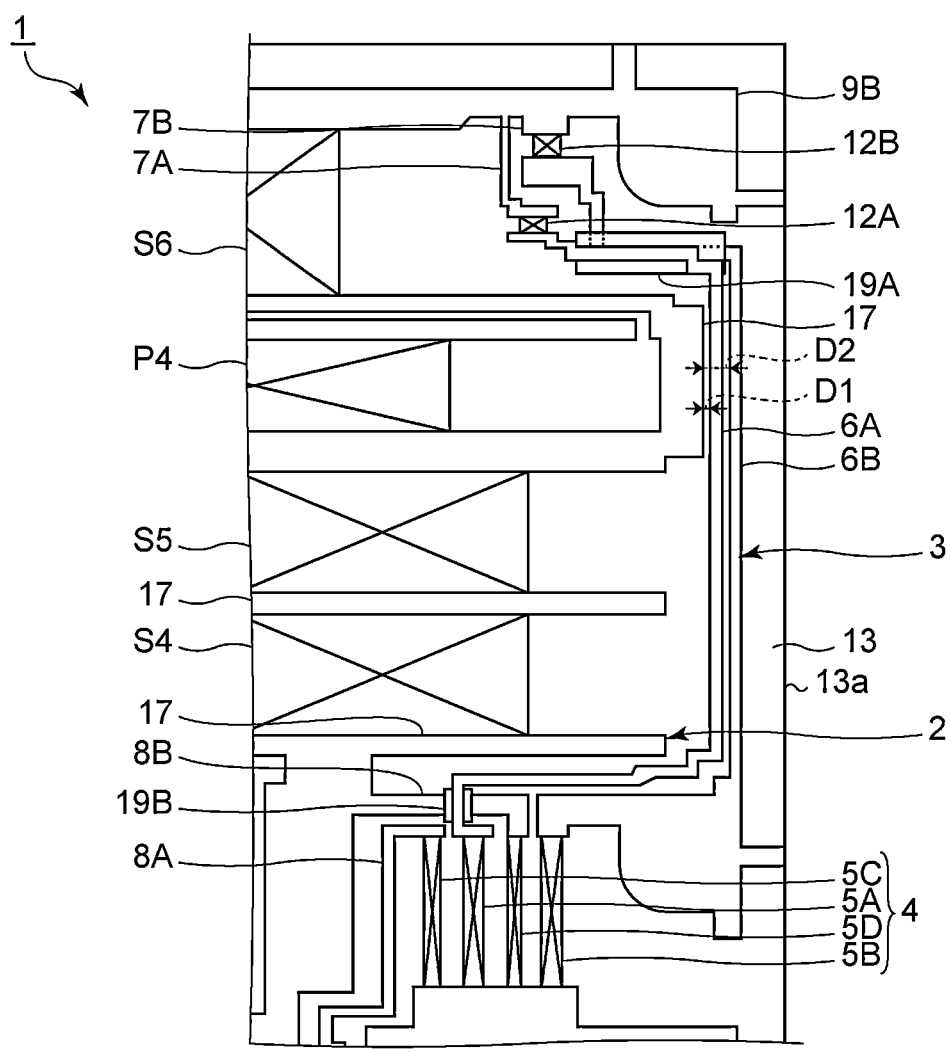
FIG. 4 is a schematic enlarged plan view illustrating an electrode configuration of a portion of the filter device according to the first preferred embodiment of the present invention near a portion where the distance between a series-arm-resonator connecting wire and each of a first I-C connecting wire and a second I-C connecting wire is shortest.

FIG. 4 is a schematic enlarged plan view illustrating an electrode configuration of a portion of the filter device according to the first preferred embodiment near a portion where the distance between a series-arm-resonator connecting wire and each of the first I-C connecting wire and the second I-C connecting wire is shortest.

Of the plurality of series-arm-resonator connecting wires 17, the series-arm-resonator connecting wire 17 between the series-arm resonator S5 and the series-arm resonator S6 is located at the position closest to the first I-C connecting wire 6A and the second I-C connecting wire 6B. In the filter device 1, the shortest distance between the first I-C connecting wire 6A and the series-arm-resonator connecting wire 17 between the series-arm resonator S5 and the series-arm resonator S6 is shortest among the shortest distances between the first I-C connecting wire 6A and the plurality of series-arm-resonator connecting wires 17. In the present preferred embodiment, the shortest distance among distances between the first I-C connecting wire 6A and the plurality of series-arm-resonator connecting wires 17 is shortest among the shortest distances between the plurality of I-C connecting wires and the plurality of series-arm-resonator connecting wires 17. The plurality of I-C connecting wires in the additional circuit 3 are the first I-C connecting wire 6A and the second I-C connecting wire 6B. Thus, the relationship D1<D2 is obtained when the shortest distance among distances between the first I-C connecting wire 6A and the plurality of series-arm-resonator connecting wires 17 is represented by a first shortest distance D1 and the shortest distance among distances between the second I-C connecting wire 6B and the plurality of series-arm-resonator connecting wires 17 is represented by a second shortest distance D2.

The present preferred embodiment is characterized in that the capacitance of the first capacitor 12A is smaller than the capacitance of the second capacitor 12B and the first shortest distance D1 is shortest among the shortest distances between the plurality of I-C connecting wires and the plurality of series-arm-resonator connecting wires 17. Thus, attenuation characteristics can be further improved. The details of this advantageous effect will be described below along with the details of a configuration of the present preferred embodiment.

As illustrated in FIG. 2, the filter circuit 2 includes an input end 9A and an output end 9B. In the present preferred embodiment, the input end 9A and the output end 9B are electrode pads. The input end 9A and the output end 9B may be wires. The series-arm resonator S1, the series-arm resonator S2, the series-arm resonator S3, the series-arm resonator S4, the series-arm resonator S5, and the series-arm resonator S6 are connected in series with each other between the input end 9A and the output end 9B. Of the plurality of series-arm resonators in the filter circuit 2, the series-arm resonator S1 is located closest to the input end 9A.

A parallel-arm resonator P1 and a parallel-arm resonator P2 are connected in parallel with each other between a point of connection between the series-arm resonator S1 and the series-arm resonator S2 and the ground potential. A parallel-arm resonator P3 is connected between a point of connection between the series-arm resonator S3 and the series-arm resonator S4 and the ground potential. A parallel-arm resonator P4 is connected between a point of connection between the series-arm resonator S5 and the series-arm resonator S6 and the ground potential. A capacitor C1 and a capacitor C2 are connected in parallel with the series-arm resonator S4 and the series-arm resonator S5. More specifically, the capacitor C1 and the capacitor C2 are connected in parallel with each other. The circuit configuration of the filter circuit 2 is not limited to that described above.

As illustrated in FIG. 1, the plurality of series-arm-resonator connecting wires 17 are provided on the piezoelectric substrate 13. A plurality of ground terminals 18 and a plurality of ground wires are also provided on the piezoelectric substrate 13. The plurality of parallel-arm resonators are connected to the ground potential with corresponding ground wires and ground terminals 18 interposed therebetween. Only at least one ground terminal 18 needs to be provided.

The plurality of series-arm resonators and the plurality of parallel-arm resonators in the filter circuit 2 are SAW (Surface Acoustic Wave) elements on the piezoelectric substrate 13. More specifically, the plurality of series-arm resonators and the plurality of parallel-arm resonators are surface acoustic wave resonators. In the filter device 1, Love waves are used in a main mode. However, the main mode used in the filter device 1 is not limited to that described above. The plurality of series-arm resonators and the plurality of parallel-arm resonators in the filter circuit 2 may include, for example, a BAW (Bulk Acoustic Wave) element. It is preferable that the plurality of series-arm resonators and the plurality of parallel-arm resonators include an acoustic wave resonator such as a SAW element or a BAW element, for example.

The additional circuit 3 includes a plurality of C-F connecting wires. The plurality of C-F connecting wires are provided on the piezoelectric substrate 13. The C-F connecting wires connect capacitors to the filter circuit. As illustrated in FIG. 4, in the present preferred embodiment, the plurality of C-F connecting wires are a first C-F connecting wire 7A and a second C-F connecting wire 7B. The first C-F connecting wire 7A connects the first capacitor 12A to the filter circuit 2. The second C-F connecting wire 7B connects the second capacitor 12B to the filter circuit 2.

The first interdigital transducer electrode 5A is electrically connected to the output end 9B without any series-arm resonator interposed therebetween. The first capacitor 12A is connected between the output end 9B and the first interdigital transducer electrode 5A. More specifically, the first interdigital transducer electrode 5A and the first capacitor 12A are connected by the first I-C connecting wire 6A. The first capacitor 12A and the output end 9B are connected by the first C-F connecting wire 7A.

In the same or similar manner, the second interdigital transducer electrode 5B is electrically connected to the output end 9B without any series-arm resonator interposed therebetween. The second capacitor 12B is connected between the output end 9B and the second interdigital transducer electrode 5B. More specifically, the second interdigital transducer electrode 5B and the second capacitor 12B are connected by the second I-C connecting wire 6B. The second capacitor 12B and the output end 9B are connected by the second C-F connecting wire 7B.

The additional circuit 3 includes a plurality of I-F connecting wires. The plurality of I-F connecting wires are provided on the piezoelectric substrate 13. The I-F connecting wires connect interdigital transducer electrodes to the filter circuit. In the present preferred embodiment, the plurality of I-F connecting wires include a first I-F connecting wire 8A and a second I-F connecting wire 8B. The first I-F connecting wire 8A connects the third interdigital transducer electrode 5C to the filter circuit 2. The second I-F connecting wire 8B connects the fourth interdigital transducer electrode 5D to the filter circuit 2. As illustrated in FIG. 1, an I-F connecting wires may connect an interdigital transducer electrode to the filter circuit without any capacitor interposed therebetween.

The third interdigital transducer electrode 5C is connected to the series-arm-resonator connecting wire 17 between the series-arm resonator S1 and the series-arm resonator S2 by the first I-F connecting wire 8A. The fourth interdigital transducer electrode 5D is connected to the series-arm-resonator connecting wire 17 between the series-arm resonator S3 and the series-arm resonator S4 by the second I-F connecting wire 8B.

As illustrated in FIG. 4, in the present preferred embodiment, for example, an $SiO_2$ layer 19A is provided on a portion of the second I-C connecting wire 6B, and a portion of the first I-C connecting wire 6A is provided on the $SiO_2$ layer 19A. Thus, a first three-dimensional wiring portion is configured. In the first three-dimensional wiring portion, the first I-C connecting wire 6A and the second I-C connecting wire 6B are electrically insulated by the $SiO_2$ layer 19A.

In contrast, for example, an $SiO_2$ layer 19B is provided on a portion of the second I-F connecting wire 8B, and a portion of the first I-C connecting wire 6A is provided on the $SiO_2$ layer 19B. Thus, a second three-dimensional wiring portion is configured. In the second three-dimensional wiring portion, the first I-C connecting wire 6A and the second I-F connecting wire 8B are electrically insulated by the $SiO_2$ layer 19B. With the configuration of the first three-dimensional wiring portion and the second three-dimensional wiring portion, the area of routing of wiring can be reduced, and the size of the filter device 1 can be reduced. However, the first three-dimensional wiring portion and the second three-dimensional wiring portion are not necessarily provided.

By comparing the present preferred embodiment with a comparative example, the details of advantageous effects of the present preferred embodiment will be described below.

Figure 5:
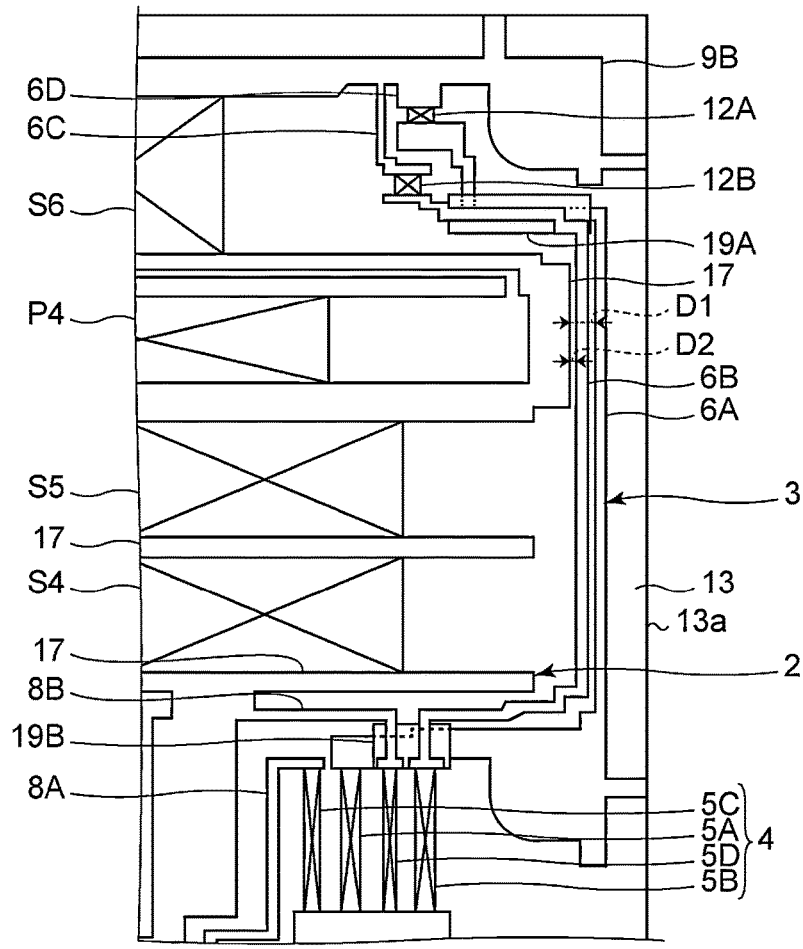
FIG. 5 is a schematic enlarged plan view illustrating an electrode configuration of a filter device according to a comparative example.

As illustrated in FIG. 5, the comparative example is different from the first preferred embodiment in that the relationship D2<D1 is obtained. To achieve the relationship D2<D1, the arrangement of the first I-C connecting wire 6A, the second I-C connecting wire 6B, and the second I-F connecting wire 8B and the configuration of the first three-dimensional wiring portion and the second three-dimensional wiring portion are different from those in the first preferred embodiment.

The filter device having the configuration of the first preferred embodiment and a filter device according to the comparative example were prepared, and attenuation-frequency characteristics were compared between the first preferred embodiment and the comparative example. For the filter device according to the first preferred embodiment and the filter device according to the comparative example, design parameters described below were used.

Figure 6:
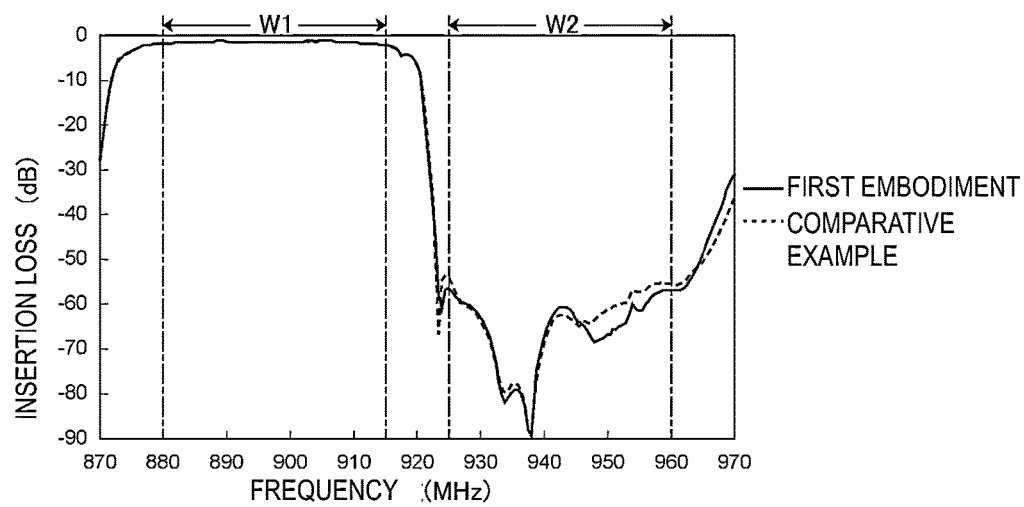
FIG. 6 is a diagram illustrating attenuation-frequency characteristics in the first preferred embodiment of the present invention and in the comparative example.

Pass band; transmission band (about 880 MHz to about 915 MHz) of Band 8
Capacitance of first capacitor 12A; about 0.03 pF
Capacitance of second capacitor 12B; about 0.10 pF
Number of pairs of electrode fingers of first interdigital transducer electrode 5A; 7.5 pairs
Number of pairs of electrode fingers of second interdigital transducer electrode 5B; 9.5 pairs
Number of pairs of electrode fingers of third interdigital transducer electrode 5C; 4.5 pairs
Number of pairs of electrode fingers of fourth interdigital transducer electrode 5D; 7.5 pairs FIG. 6 is a diagram illustrating attenuation-frequency characteristics of the first preferred embodiment and the comparative example. In FIG. 6, a band W1 represents a transmission band (about 880 MHz to about 915 MHz) of Band 8, and a band W2 represents a reception band (about 925 MHz to about 960 MHz) of Band 8.

As shown in FIG. 6, the attenuation amount in the first preferred embodiment is larger than the attenuation amount in the comparative example in the band W2 on the whole. As described above, in the first preferred embodiment, the attenuation characteristics can further be improved.

To increase the attenuation amount by using an additional circuit, the additional circuit is connected in parallel with the filter circuit. Thus, the distance between a hot wire in the filter circuit and a hot wire in the additional circuit is often short. Therefore, the hot wire in the filter circuit may be electromagnetically coupled to the hot wire in the additional circuit. The electromagnetic coupling may cause a portion of a signal in the filter circuit to leak into the additional circuit. In this case, the leaked signal from the hot wire of the additional circuit may reach the output end of the filter circuit, and this may deteriorate the attenuation characteristics. In the comparative example, such a signal leakage deteriorates the attenuation characteristics.

In contrast, in the present preferred embodiment, the capacitance of the first capacitor 12A is smaller than the capacitance of the second capacitor 12B and the first shortest distance D1 is shortest among shortest distances between the plurality of I-C connecting wires and the plurality of series-arm-resonator connecting wires 17. As illustrated in FIG. 4, since the first shortest distance D1 is relatively short, electromagnetic coupling between the first I-C connecting wire 6A and the series-arm-resonator connecting wire 17 may occur. The first I-C connecting wire 6A is connected to the first capacitor 12A. Since the capacitance of the first capacitor 12A is relatively small, the impedance of the first capacitor 12A is relatively high. Thus, even if a signal from the filter circuit 2 leaks to the first I-C connecting wire 6A, the signal is prevented from reaching the output end 9B. Thus, the impact of signal leakage on the attenuation characteristics can be reduced, and deterioration of the attenuation characteristics can be reduced.

In contrast, although the capacitance of the second capacitor 12B is relatively large, the second capacitor 12B is connected to the second I-C connecting wire 6B and the second shortest distance D2 is relatively long. Thus, electromagnetic coupling between the second I-C connecting wire 6B and the series-arm-resonator connecting wire 17 can be prevented. Therefore, signal leakage from the filter circuit 2 to the second I-C connecting wire 6B can be prevented. Consequently, deterioration of the attenuation characteristics can be further reduced.

The filter device 1 whose attenuation-frequency characteristics are illustrated in FIG. 6 has a pass band that is the transmission band of Band 8, and the attenuation amount in the reception band of Band 8 can be increased. Thus, in the case where the filter device 1 is used as a transmission filter for a duplexer whose communication band is Band 8, the isolation characteristics can be effectively improved. Alternatively, in the case where the filter device 1 is used for a multiplexer including the reception filter of Band 8, the isolation characteristics can be improved.

It is preferable that the first I-C connecting wire 6A is provided in at least a portion of an area between the second I-C connecting wire 6B and the series-arm-resonator connecting wire 17 in the filter circuit 2. It is more preferable that the first I-C connecting wire 6A is provided between the second I-C connecting wire 6B and a series-arm-resonator connecting wire 17 in a portion where the distance between the second I-C connecting wire 6B and the series-arm-resonator connecting wire 17 is shortest. In this case, the first I-C connecting wire 6A achieves an advantageous effect as an electromagnetic shield between the second I-C connecting wire 6B and the series-arm-resonator connecting wire 17. Thus, electromagnetic coupling between the second I-C connecting wire 6B and the series-arm-resonator connecting wire 17 can be further reduced, and deterioration of the attenuation communication apparatus can be further reduced.

In the portion where the distance between the second I-C connecting wire 6B and the series-arm-resonator connecting wire 17 is shortest, it is preferable that the first I-C connecting wire 6A and the second I-C connecting wire 6B extend in parallel or substantially in parallel. Thus, the first I-C connecting wire 6A can achieve an advantageous effect as an electromagnetic shield over a wide range more reliably, and electromagnetic coupling between the second I-C connecting wire 6B and the series-arm-resonator connecting wire 17 can be more reliably prevented.

In the first preferred embodiment, without a ground wire for an electromagnetic shield being arranged between the second I-C connecting wire 6B and the series-arm-resonator connecting wire 17, leakage of a signal can be reduced as described above. It is preferable that no ground wire be provided in at least a portion of an area between the second I-C connecting wire 6B and the series-arm-resonator connecting wire 17. Thus, the attenuation characteristics can be improved, and the size of the filter device 1 can be reduced.

The plurality of capacitors in the additional circuit 3 may include at least one capacitor that is different from the first capacitor 12A and the second capacitor 12B. The plurality of I-C connecting wires in the additional circuit 3 may include at least one I-C connecting wire that is different from the first I-C connecting wire 6A and the second I-C connecting wire 6B. Even in this case, the capacitance of the first capacitor 12A only needs to be smaller than the capacitance of the second capacitor 12B and the first shortest distance D1 only needs to be shortest among shortest distances between the plurality of I-C connecting wires of the additional circuit 3 and the plurality of series-arm-resonator connecting wires 17 of the filter circuit 2. Thus, the impedance of the first capacitor 12A is larger than at least the impedance of the second capacitor 12B and the first I-C connecting wire 6A is most likely to be electromagnetically coupled to the series-arm-resonator connecting wire 17. Therefore, deterioration of the attenuation characteristics can be reduced. In addition, without any ground wire between the first I-C connecting wire 6A and the series-arm-resonator connecting wire 17, deterioration of the attenuation characteristics can thus be reduced. It is preferable that no ground wire is provided in at least a portion of the area between the first I-C connecting wire 6A and the series-arm-resonator connecting wire 17. Thus, the attenuation characteristics can be improved, and the size of the filter device 1 can be reduced.

In a typical filter device in which an additional circuit is connected to a filter circuit, the filter circuit occupies a large portion of the filter device. Thus, the additional circuit is often provided near an edge portion of a piezoelectric substrate. A hot wire of the additional circuit is often provided alongside a hot wire of the filter circuit. Thus, a portion where the distance between the hot wire of the additional circuit and the hot wire of the filter circuit is shortest may be located near the edge portion of the piezoelectric substrate.

As illustrated in FIG. 4, in the first preferred embodiment, a portion where the distance between the first I-C connecting wire 6A and the series-arm-resonator connecting wire 17 is shortest and a portion where the distance between the second I-C connecting wire 6B and the series-arm-resonator connecting wire 17 is shortest are located near an edge portion 13a of the piezoelectric substrate 13. In such a case, on the piezoelectric substrate 13, it is preferable that the first I-C connecting wire 6A is provided at a position farther away from the edge portion 13a of the piezoelectric substrate 13 than the second I-C connecting wire 6B is. Thus, the relationship D1<D2 can be obtained more reliably, and the attenuation characteristics can be improved more reliably and more effectively.

Herein, the edge portion 13a of the piezoelectric substrate 13 is any one of a plurality of sides corresponding to outer peripheral edges of the piezoelectric substrate 13. The first I-C connecting wire 6A and the second I-C connecting wire 6B of the additional circuit 3 extend in parallel or substantially in parallel with the edge portion 13a near the first I-C connecting wire 6A and the second I-C connecting wire 6B.

In the case where the plurality of I-C connecting wires of the additional circuit 3 include an I-C connecting wire that is different from the first I-C connecting wire 6A and the second I-C connecting wire 6B, it is preferable that the first I-C connecting wire 6A is provided at a position farthest away from the edge portion 13a of the piezoelectric substrate 13. Thus, the first shortest distance D1 can be made shortest more reliably among shortest distances between the plurality of I-C connecting wires and the series-arm-resonator connecting wires 17. Meanwhile, it is preferable that the second I-C connecting wire 6B is provided at a position closest to the edge portion 13a of the piezoelectric substrate 13. Thus, the second shortest distance D2 can be made longest more reliably among shortest distances between the plurality of I-C connecting wires and the series-arm-resonator connecting wires 17.

In the first preferred embodiment, the series-arm-resonator connecting wire 17 that is connected to the series-arm resonator S5 and the series-arm resonator S6 includes a portion located near the edge portion 13a of the piezoelectric substrate 13. The series-arm-resonator connecting wire 17 is provided at the position closest to the first I-C connecting wire 6A and the second I-C connecting wire 6B among the plurality of series-arm-resonator connecting wires 17. More specifically, the series-arm-resonator connecting wire 17, the first I-C connecting wire 6A, and the second I-C connecting wire 6B extend in parallel or substantially in parallel near the edge portion 13a. Thus, the first I-C connecting wire 6A can achieve an advantageous effect as an electromagnetic shield over a wide range more reliably. However, the arrangement of wiring is not limited to the above. For example, the series-arm-resonator connecting wire 17 that is closest to the first I-C connecting wire 6A and the second I-C connecting wire 6B does not necessarily extend in parallel or substantially in parallel with the first I-C connecting wire 6A or the second I-C connecting wire 6B. Alternatively, the series-arm-resonator connecting wire 17 that is closest to the first I-C connecting wire 6A and the second I-C connecting wire 6B may be a series-arm-resonator connecting wire 17 that is located near the center of the piezoelectric substrate 13.

As illustrated in FIG. 4, the first capacitor 12A is connected to the first interdigital transducer electrode 5A of the resonator 4. The second capacitor 12B is connected to the second interdigital transducer electrode 5B. The capacitance of the first capacitor 12A can be adjusted by adjusting the number of pairs of electrode fingers of the first interdigital transducer electrode 5A. In the same or similar manner, the capacitance of the second capacitor 12B can be adjusted by adjusting the number of pairs of electrode fingers of the second interdigital transducer electrode 5B. It is preferable that the number of pairs of the electrode fingers of the first interdigital transducer electrode 5A is larger than the number of pairs of the electrode fingers of the second interdigital transducer electrode 5B. Thus, the capacitance of the first capacitor 12A can be made smaller than the capacitance of the second capacitor 12B. Furthermore, since the capacitance of the first capacitor 12A can be made smaller than the capacitance of the second capacitor 12B without the area of the second capacitor 12B being increased, the size of the filter device 1 can be reduced.

As illustrated in FIG. 3, in the present preferred embodiment, the resonator 4 is a longitudinally-coupled-resonator acoustic wave filter. The resonator 4 does not necessarily include the reflector 16A or the reflector 16B. In this case, the resonator 4 may be of a transversal resonator.

In the first preferred embodiment, the first comb-shaped electrodes of the interdigital transducer electrodes in the resonator 4 are connected to the signal potential, and the second comb-shaped electrodes of the interdigital transducer electrodes are connected to the ground potential. However, the second comb-shaped electrodes of the interdigital transducer electrodes may be connected to the signal potential and the first comb-shaped electrodes of the interdigital transducer electrodes may be connected to the ground potential. For example, in the case where the first comb-shaped electrode of the second interdigital transducer electrode 5B is connected to the signal potential and the second comb-shaped electrode of the second interdigital transducer electrode 5B is connected to the ground potential, the first comb-shaped electrode of the third interdigital transducer electrode 5C may be connected to the ground potential and the second comb-shaped electrode of the third interdigital transducer electrode 5C may be connected to the signal potential.

As illustrated in FIG. 4, in the filter device 1, the first capacitor 12A and the second capacitor 12B are connected between the interdigital transducer electrodes on the output side and the filter circuit 2. It is preferable that at least one of the first capacitor 12A and the second capacitor 12B is connected to the output end 9B without any series-arm resonator interposed therebetween. In this case, since the impact of a signal output from the additional circuit 3 especially on attenuation characteristics and the like is large, the attenuation characteristics can be improved more easily, and the present invention is particularly suitable for this configuration.

As in the first preferred embodiment, it is preferable that the first I-C connecting wire 6A is longer than the first C-F connecting wire 7A. Thus, the first C-F connecting wire 7A is less likely to be electromagnetically coupled to the series-arm-resonator connecting wire 17. Therefore, a signal from the filter circuit 2 is less likely to leak to the first C-F connecting wire 7A, and deterioration of the attenuation characteristics can be reduced more reliably.

It is preferable that the second I-C connecting wire 6B is longer than the second C-F connecting wire 7B. Thus, the second C-F connecting wire 7B is less likely to be electromagnetically coupled to the series-arm-resonator connecting wire 17. Therefore, a signal from the filter circuit 2 is less likely to leak to the second C-F connecting wire 7B, and deterioration of the attenuation characteristics can be reduced more reliably.

A capacitor that is connected between an output-side interdigital transducer electrode and the filter circuit will be referred to as an output-side capacitor, and a capacitor that is connected between an input-side interdigital transducer electrode and the filter circuit will be referred to as an input-side capacitor. In the filter device 1, the first capacitor 12A and the second capacitor 12B are output-side capacitors. However, the first capacitor 12A and the second capacitor 12B may be input-side capacitors.

Figure 7:
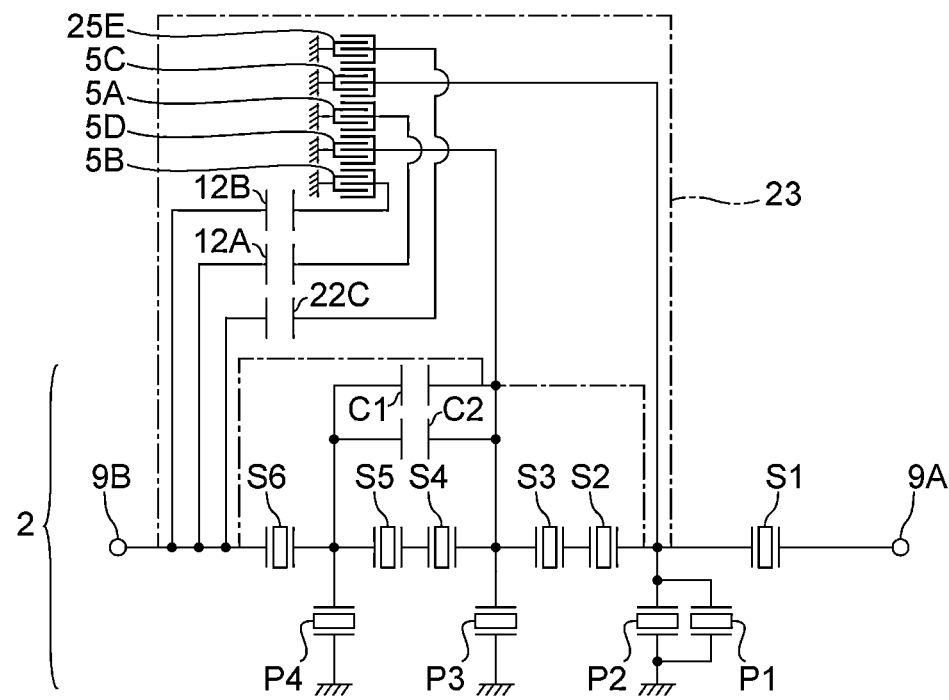
FIG. 7 is a circuit diagram of a filter device according to a second preferred embodiment of the present invention.

FIG. 7 is a circuit diagram of a filter device according to a second preferred embodiment of the present invention.

The present preferred embodiment is different from the first preferred embodiment in that a plurality of interdigital transducer electrodes in a resonator include a fifth interdigital transducer electrode 25E and in an electrode configuration of a portion between the fifth interdigital transducer electrode 25E and the filter circuit 2. Apart from the points described above, the filter device according to the present preferred embodiment has a configuration the same as or similar to that of the filter device 1 according to the first preferred embodiment.

As illustrated in FIG. 7, the fifth interdigital transducer electrode 25E is an output-side interdigital transducer electrode. The fifth interdigital transducer electrode 25E is electrically connected to the output end 9B without any series-arm resonator interposed therebetween.

A plurality of capacitors in an additional circuit 23 include a third capacitor 22C that is different from the first capacitor 12A and the second capacitor 12B. A plurality of I-C connecting wires in the additional circuit 23 include a third I-C connecting wire that is different from the first I-C connecting wire 6A and the second I-C connecting wire 6B. Furthermore, a plurality of C-F connecting wires include a third C-F connecting wire that is different from the first C-F connecting wire 7A and the second C-F connecting wire 7B. The third capacitor 22C is connected between the fifth interdigital transducer electrode 25E and the filter circuit 2. The fifth interdigital transducer electrode 25E and the third capacitor 22C are connected by the third I-C connecting wire. The third capacitor 22C and the filter circuit 2 are connected by the third C-F connecting wire.

The capacitance of the third capacitor 22C is larger than the capacitance of the first capacitor 12A and smaller than the capacitance of the second capacitor 12B. Thus, the capacitance of the first capacitor 12A is smallest among the capacitances of the plurality of capacitors in the additional circuit 23, and the capacitance of the second capacitor 12B is largest among the capacitances of the plurality of capacitors in the additional circuit 23. Therefore, the impedance of the first capacitor 12A is highest among the impedances of the plurality of capacitors in the additional circuit 23, and the impedance of the second capacitor 12B is lowest among the impedances of the plurality of capacitors in the additional circuit 23.

When the shortest distance among distances between the third I-C connecting wire and the plurality of series-arm-resonator connecting wires 17 is represented by a third shortest distance D23, the relationship D1<D23<D2 is obtained in the present preferred embodiment. As described above, the first shortest distance D1 is shortest among the shortest distances between the plurality of I-C connecting wires of the additional circuit 23 and the plurality of series-arm-resonator connecting wires 17 of the filter circuit 2. Thus, of the plurality of I-C connecting wires, the first I-C connecting wire 6A is most likely to be electromagnetically coupled to the series-arm-resonator connecting wire 17. As in the first preferred embodiment, the first I-C connecting wire 6A is connected to the first capacitor 12A. The impedance of the first capacitor 12A is highest among impedances of the plurality of capacitors in the additional circuit 23. Thus, even if the first I-C connecting wire 6A is electromagnetically coupled to the series-arm-resonator connecting wire 17, the impact on the attenuation characteristics is small. Therefore, deterioration of the attenuation characteristics can be reduced more reliably.

Furthermore, the second shortest distance D2 is longest among the shortest distances between the plurality of I-C connecting wires of the additional circuit 23 and the plurality of series-arm-resonator connecting wires 17 of the filter circuit 2. Thus, of the plurality of I-C connecting wires, the second I-C connecting wire 6B is least likely to be electromagnetically coupled to the series-arm-resonator connecting wire 17. The second I-C connecting wire 6B is connected to the second capacitor 12B. The impedance of the second capacitor 12B is lowest among impedances of the plurality of capacitors in the additional circuit 23. As described above, electromagnetic coupling between the second I-C connecting wire 6B and the series-arm-resonator connecting wire 17 can be reduced. Thus, the attenuation characteristics can be improved more reliably.

A multiplexer according to a preferred embodiment of the present invention will be described below.

Figure 8:
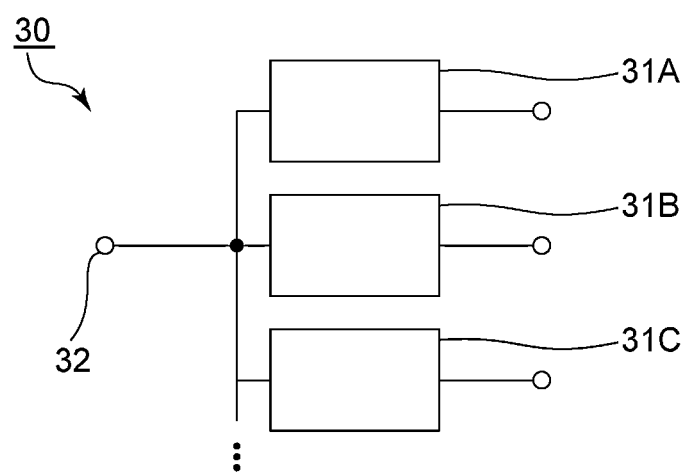
FIG. 8 is a schematic diagram of a multiplexer according to a third preferred embodiment of the present invention.

FIG. 8 is a schematic diagram of a multiplexer according to a third preferred embodiment of the present invention.

A multiplexer 30 includes a common connection terminal 32, a first filter device 31A, a second filter device 31B, and a third filter device 31C. The first filter device 31A, the second filter device 31B, and the third filter device 31C are connected in common to the common connection terminal 32. The multiplexer 30 also includes a plurality of filter devices different from the first filter device 31A, the second filter device 31B, and the third filter device 31C. However, the number of filter devices in the multiplexer 30 is not particularly limited. The multiplexer 30 only needs to include at least three or more filter devices. The multiplexer 30 may include both a transmission filter and a reception filter. Alternatively, the multiplexer 30 may include only a transmission filter or only a reception filter.

The first filter device 31A has the configuration of the first preferred embodiment or the second preferred embodiment. Only at least one of the filter devices in the multiplexer 30 needs to be a filter device according to a preferred embodiment of the present invention.

The multiplexer 30 according to the present preferred embodiment includes the first filter device 31A and can thus improve the attenuation characteristics as in the first preferred embodiment and the second preferred embodiment. Therefore, the impact of the first filter device 31A on the filter characteristics of other filter devices can be reduced, and the isolation characteristics can be effectively improved.

The filter devices according to the foregoing preferred embodiments can be used as filters for high frequency front end circuits. This example will be explained below.

Figure 9:
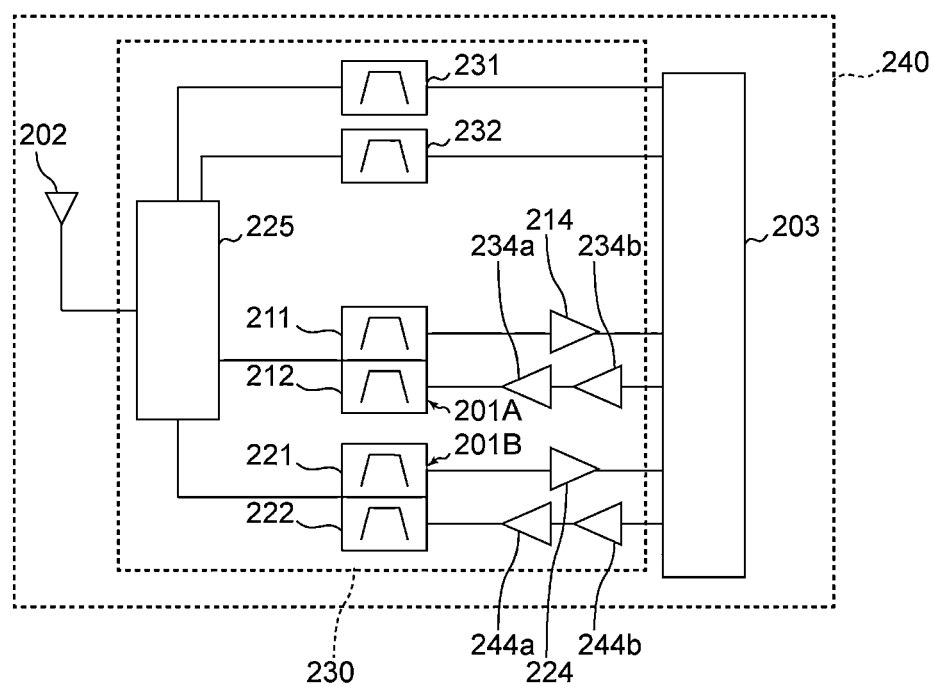
FIG. 9 is a configuration diagram illustrating an example of a communication apparatus and a high frequency front end circuit according to a preferred embodiment of the present invention.

FIG. 9 is a configuration diagram illustrating an example of a communication apparatus and a high frequency front end circuit according to a preferred embodiment of the present invention. In FIG. 9, component elements connected to a high frequency front end circuit 230, such as an antenna element 202 and an RF signal processing circuit (RFIC) 203, for example, are also illustrated. The high frequency front end circuit 230 and the RF signal processing circuit 203 define a communication apparatus 240. The communication apparatus 240 may include a power source, a CPU, and a display, for example.

The high frequency front end circuit 230 includes a switch 225, duplexers 201A and 201B, filters 231 and 232, low noise amplifier circuits 214 and 224, and power amplifier circuits 234a, 234b, 244a, and 244b. The high frequency front end circuit 230 and the communication apparatus 240 in FIG. 9 are examples of a high frequency front end circuit and a communication apparatus but are not limited to the configurations described above.

The duplexer 201A includes filters 211 and 212. The duplexer 201B includes filters 221 and 222. The duplexers 201A and 201B are connected to the antenna element 202 with the switch 225 interposed therebetween.

The switch 225 connects the antenna element 202 to a signal path corresponding to a predetermined band in accordance with a control signal from a controller (not illustrated in the figure) and is, for example, an SPDT (Single Pole Double Throw) switch. The number of signal paths connected to the antenna element 202 is not necessarily one and the antenna element 202 may be connected to a plurality of signal paths. That is, the high frequency front end circuit 230 may support carrier aggregation.

The low noise amplifier circuit 214 is a reception amplifier circuit that amplifies a high frequency signal (in this case, a high frequency reception signal) that has passed through the antenna element 202, the switch 225, and the duplexer 201A and outputs the amplified high frequency signal to the RF signal processing circuit 203. The low noise amplifier circuit 224 is a reception amplifier circuit that amplifies a high frequency signal (in this case, a high frequency reception signal) that has passed through the antenna element 202, the switch 225, and the duplexer 201B and outputs the amplified high frequency signal to the RF signal processing circuit 203.

The power amplifier circuits 234a and 234b are transmission amplifier circuits that amplify a high frequency signal (in this case, a high frequency transmission signal) output from the RF signal processing circuit 203 and output the amplified high frequency signal to the antenna element 202 through the duplexer 201A and the switch 225. The power amplifier circuits 244a and 244b are transmission amplifier circuits that amplify a high frequency signal (in this case, a high frequency transmission signal) output from the RF signal processing circuit 203 and output the amplified high frequency signal to the antenna element 202 through the duplexer 201B and the switch 225.

The RF signal processing circuit 203 performs signal processing such as, for example, down-conversion on a high frequency reception signal input through a reception signal path from the antenna element 202, and outputs a reception signal generated by the signal processing. Furthermore, the RF signal processing circuit 203 performs signal processing such as, for example, up-conversion on an input transmission signal, and outputs a high frequency transmission signal generated by the signal processing to the power amplifier circuits 234a, 234b, 244a, and 244b. The RF signal processing circuit 203 is, for example, an RFIC. The communication apparatus may include, for example, a BB (baseband) IC. In this case, the BBIC performs signal processing on a reception signal processed by the RFIC. Furthermore, the BBIC performs signal processing on a transmission signal and outputs the processed transmission signal to the RFIC. A reception signal that has been processed by the BBIC and a transmission signal that is to be signal-processed by the BBIC are, for example, image signals, audio signals, and the like.

The high frequency front end circuit 230 may include duplexers according to a modification of the duplexers 201A and 201B, in place of the duplexers 201A and 201B.

In contrast, the filters 231 and 232 in the communication apparatus 240 are connected between the RF signal processing circuit 203 and the switch 225 without the low noise amplifier circuits 214 and 224 and the power amplifier circuits 234a, 234b, 244a, and 244b interposed therebetween. As with the duplexers 201A and 201B, the filters 231 and 232 are also connected to the antenna element 202 with the switch 225 interposed therebetween.

A high frequency front end circuit and a communication apparatus according to a preferred embodiment of the present invention include a filter device according to a foregoing preferred embodiment of the present invention described above and can thus effectively improve attenuation characteristics.

Filter devices, multiplexers, high frequency front end circuits, and communication apparatuses according to preferred embodiments of the present invention have been described above. However, other preferred embodiments obtained by combining component elements in the foregoing preferred embodiments, modifications obtained by making various changes to the forgoing preferred embodiments that can be conceived by those skilled in the art without departing from the scope of the present invention, and various types of equipment in which a high frequency front end circuit and a communication apparatus according to preferred embodiments of the present invention are included are also included in the present invention.

Preferred embodiments of the present invention can be widely used, as a filter, a duplexer, a multiplexer that can be applied to a multiband system, a front end circuit, and a communication apparatus, for communication equipment such as a cellular phone.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A filter device comprising:
a filter circuit including at least three series-arm resonators on a piezoelectric substrate, an input end, an output end, and a plurality of series-arm-resonator connecting wires connecting the plurality of series-arm resonators in series to each other between the input end and the output end; and
an additional circuit including a resonator including at least three interdigital transducer electrodes, a plurality of capacitors, and a plurality of I-C connecting wires each connecting any one of at least two of the at least three interdigital transducer electrodes to any one of the plurality of capacitors, the additional circuit being connected in parallel with at least a portion of the series-arm resonators in the filter circuit; wherein
the at least three interdigital transducer electrodes include a first interdigital transducer electrode and a second interdigital transducer electrode;
the first interdigital transducer electrode and the second interdigital transducer electrode are input-side interdigital transducer electrodes or output-side interdigital transducer electrodes;
the plurality of capacitors include a first capacitor and a second capacitor;
the first interdigital transducer electrode and the first capacitor are connected by a first I-C connecting wire of the plurality of I-C connecting wires, and the second interdigital transducer electrode and the second capacitor are connected by a second I-C connecting wire of the plurality of I-C connecting wires;
a capacitance of the first capacitor is smaller than a capacitance of the second capacitor;
a shortest distance among distances between the first I-C connecting wire and the plurality of series-arm-resonator connecting wires in the filter circuit is shortest among shortest distances between the plurality of I-C connecting wires and the plurality of series-arm-resonator connecting wires;
the capacitance of the second capacitor is largest among capacitances of the plurality of capacitors; and
a shortest distance among distances between the second I-C connecting wire and the plurality of series-arm-resonator connecting wires in the filter circuit is longest among shortest distances between the plurality of I-C connecting wires and the plurality of series-arm-resonator connecting wires.

2. The filter device according to claim 1, wherein the capacitance of the first capacitor is smallest among capacitances of the plurality of capacitors.

3. The filter device according to claim 1, wherein
the filter circuit and the additional circuit are on the piezoelectric substrate; and
on the piezoelectric substrate, the first I-C connecting wire is at a position farther away from an edge portion of the piezoelectric substrate than the second I-C connecting wire is.

4. The filter device according to claim 3, wherein on the piezoelectric substrate, of the plurality of I-C connecting wires, the first I-C connecting wire is at a position farthest away from the edge portion of the piezoelectric substrate.

5. The filter device according to claim 3, wherein on the piezoelectric substrate, of the plurality of I-C connecting wires, the second I-C connecting wire is at a position closest to the edge portion of the piezoelectric substrate.

6. The filter device according to claim 1, wherein
the additional circuit includes a first C-F connecting wire that connects the first capacitor to the filter circuit; and
the first I-C connecting wire is longer than the first C-F connecting wire.

7. The filter device according to claim 1, wherein
the additional circuit includes a second C-F connecting wire that connects the second capacitor to the filter circuit; and
the second I-C connecting wire is longer than the second C-F connecting wire.

8. The filter device according to claim 1, wherein
each of the first interdigital transducer electrode and the second interdigital transducer electrode includes a plurality of electrode fingers; and
a number of pairs of the electrode fingers of the first interdigital transducer electrode is larger than a number of pairs of the electrode fingers of the second interdigital transducer electrode.

9. The filter device according to claim 1, wherein a ground wire connected to a ground potential is not provided in at least a portion of an area between the first I-C connecting wire and the plurality of series-arm-resonator connecting wires.

10. The filter device according to claim 1, wherein the plurality of series-arm resonators include an acoustic wave resonator.

11. A multiplexer comprising:
a common connection terminal; and
a plurality of filter devices connected in common to the common connection terminal; wherein
the plurality of filter devices includes the filter device according to claim 1.

12. The multiplexer according to claim 11, wherein the capacitance of the first capacitor is smallest among capacitances of the plurality of capacitors.

13. The multiplexer according to claim 11, wherein
the filter circuit and the additional circuit are on the piezoelectric substrate; and
on the piezoelectric substrate, the first I-C connecting wire is at a position farther away from an edge portion of the piezoelectric substrate than the second I-C connecting wire is.

14. The multiplexer according to claim 13, wherein on the piezoelectric substrate, of the plurality of I-C connecting wires, the first I-C connecting wire is at a position farthest away from the edge portion of the piezoelectric substrate.

15. The multiplexer according to claim 13, wherein on the piezoelectric substrate, of the plurality of I-C connecting wires, the second I-C connecting wire is at a position closest to the edge portion of the piezoelectric substrate.

16. A high frequency front end circuit comprising:
a plurality of filter devices; and
a power amplifier connected to the plurality of filter devices; wherein
the plurality of filter devices include the filter device according to claim 1.

17. A communication apparatus comprising:
the high frequency front end circuit according to claim 14; and
an RF signal processing circuit connected to the high frequency front end circuit.

18. A filter device comprising:
a filter circuit including at least three series-arm resonators on a piezoelectric substrate, an input end, an output end, and a plurality of series-arm-resonator connecting wires connecting the plurality of series-arm resonators in series to each other between the input end and the output end; and
an additional circuit including a resonator including at least three interdigital transducer electrodes, a plurality of capacitors, and a plurality of I-C connecting wires each connecting any one of at least two of the at least three interdigital transducer electrodes to any one of the plurality of capacitors, the additional circuit being connected in parallel with at least a portion of the series-arm resonators in the filter circuit; wherein
the at least three interdigital transducer electrodes include a first interdigital transducer electrode and a second interdigital transducer electrode;
the first interdigital transducer electrode and the second interdigital transducer electrode are input-side interdigital transducer electrodes or output-side interdigital transducer electrodes;
the plurality of capacitors include a first capacitor and a second capacitor;
the first interdigital transducer electrode and the first capacitor are connected by a first I-C connecting wire of the plurality of I-C connecting wires, and the second interdigital transducer electrode and the second capacitor are connected by a second I-C connecting wire of the plurality of I-C connecting wires;
a capacitance of the first capacitor is smaller than a capacitance of the second capacitor;
a shortest distance among distances between the first I-C connecting wire and the plurality of series-arm-resonator connecting wires in the filter circuit is shortest among shortest distances between the plurality of I-C connecting wires and the plurality of series-arm-resonator connecting wires; and
at least one of the first capacitor and the second capacitor is electrically connected to the output end without any of the at least three series-arm resonators interposed therebetween.

19. The multiplexer according to claim 18, wherein
the capacitance of the second capacitor is largest among capacitances of the plurality of capacitors; and
a shortest distance among distances between the second I-C connecting wire and the plurality of series-arm-resonator connecting wires in the filter circuit is longest among shortest distances between the plurality of I-C connecting wires and the plurality of series-arm-resonator connecting wires.

* * * * *